(12) United States Patent
Zhang et al.

(10) Patent No.: US 12,065,761 B2
(45) Date of Patent: Aug. 20, 2024

(54) ADDITIVE FABRICATION METHOD OF TRANSPARENT ROCK MICROMODELS WITH IN-SITU MINERAL COATING

(71) Applicant: Khalifa University of Science and Technology, Abu Dhabi (AE)

(72) Inventors: Tiejun Zhang, Abu Dhabi (AE); Hongxia Li, Abu Dhabi (AE); Aikifa Raza, Abu Dhabi (AE)

(73) Assignee: Khalifa University of Science and Technology, Abu Dhabi (AE)

( * ) Notice: Subject to any disclaimer, the term of this patent is extended or adjusted under 35 U.S.C. 154(b) by 311 days.

(21) Appl. No.: 17/621,161

(22) PCT Filed: Apr. 22, 2020

(86) PCT No.: PCT/IB2020/053826
§ 371 (c)(1),
(2) Date: Dec. 20, 2021

(87) PCT Pub. No.: WO2020/260962
PCT Pub. Date: Dec. 30, 2020

(65) Prior Publication Data
US 2022/0325433 A1    Oct. 13, 2022

Related U.S. Application Data

(60) Provisional application No. 62/867,682, filed on Jun. 27, 2019.

(51) Int. Cl.
C30B 7/06          (2006.01)
B33Y 50/00         (2015.01)
B33Y 80/00         (2015.01)

(52) U.S. Cl.
CPC ............... C30B 7/06 (2013.01); B33Y 50/00 (2014.12); B33Y 80/00 (2014.12)

(58) Field of Classification Search
CPC ............ C30B 7/07; B33Y 50/00; B33Y 80/00
See application file for complete search history.

(56) References Cited

U.S. PATENT DOCUMENTS 7,829,439 B2 * 11/2010 Kida ................... B23K 26/40
                                                438/462
9,221,970 B2 * 12/2015 Schultz ................. C08L 63/00
(Continued)

FOREIGN PATENT DOCUMENTS

CN      108819215      11/2018
EP        0699703       3/1996

OTHER PUBLICATIONS

Yoon et al "pore-scale analysis of calicym carbonate precipitation and dissolution kinetics in a microfluidic device" Environemtal science and technology 2019 53 14233-14242.*
(Continued)

Primary Examiner — Robert M Kunemund
(74) Attorney, Agent, or Firm — Kilpatrick Townsend & Stockton LLP

(57) ABSTRACT

Methods of preparing a mineral-coated rock micromodel can include 3D-printing a transparent porous micromodel with photo-curable polymer, seeding a thin layer of mineral nanoparticles in the network of pores inside the micromodel, and subsequently growing a mineral layer on the thin layer of mineral nanoparticles. The thin layer of mineral nanoparticles can be introduced by injecting a suspension containing the mineral nanoparticles through the microporous polymer micromodel, and the mineral layer can be grown in-situ on the thin layer of mineral nanoparticles in the network of pores by injecting an ion-rich solution configured to crystallize from solution in response to contacting the mineral nanoparticles.

22 Claims, 11 Drawing Sheets

(56) References Cited

U.S. PATENT DOCUMENTS

| | | | |
|---|---|---|---|
| 10,639,327 B1* | 5/2020 | Som | A61K 47/42 |
| 10,669,156 B1* | 6/2020 | Wang | C07C 27/00 |
| 2011/0076396 A1 | 3/2011 | Guan et al. | |
| 2020/0308055 A1* | 10/2020 | Pokroy | C04B 35/06 |
| 2021/0147736 A1* | 5/2021 | Zahir | F28D 20/02 |
| 2021/0246363 A1* | 8/2021 | Al-Jawad | C09K 8/94 |

OTHER PUBLICATIONS

Alzahid et al., "Functionalisation of Polydimethylsiloxane (PDMS)Microfluidic Devices coated with Rock Minerals", Scientific Reports, vol. 8, No. 1, Oct. 10, 2018, pp. 15518-15518.

Badri et al., "Imaging Micro-Scale Multiphase Flow In 30-Printed Porous Micromodels", Research And Development Petroleum Conference And Exhibition, Jul. 28, 2018, pp. 1-3.

Application No. EP20831848.5 , Extended European Search Report, Mailed On Jun. 6, 2023, 8 pages.

Lee et al., "Site-Selective In Situ Grown Calcium Carbonate Micromodels with Tunable Geometry, Porosity, and Wettability", Advanced Functional Materials, vol. 26, No. 27, May 20, 2016, pp. 4896-4905.

Application No. PCT/IB2020/053826 , International Search Report and Written Opinion, Mailed On Nov. 9, 2020, 6 pages.

\* cited by examiner

300a

300b

Before Seeding     After Seeding

ADDITIVE FABRICATION METHOD OF TRANSPARENT ROCK MICROMODELS WITH IN-SITU MINERAL COATING

CROSS-REFERENCE TO RELATED APPLICATIONS

This application claims priority to U.S. Provisional Application 62/867,682, filed on Jun. 27, 2019, the entire contents of each of which is incorporated herein in its entirety.

BACKGROUND 3D printing, also known as additive manufacturing, is developing rapidly owing to its capability in quick prototyping complex structures for biomedical, aerospace, subsurface, robotics, energy, and many emerging applications. Microscale 3D printing technology is achieving higher and higher resolution. With a micro-stereolithography (µ-SL) printing system, the minimum feature size reached tens of micron in 2018. In a µ-SL printing system, a 3D object is built layer-by-layer by solidifying photo-curable resin with a desired light pattern. A more recent strategy uses digital light projection (DLP) as a mask to shape the light pattern during the exposure.

In DLP-based µ-SL, the printing resolution is determined by the size of the projected pixel. Micro-channels with 18 µm width have been successfully printed by a customized µ-SL printer. In µ-SL printing, the photo-curable resins that can be used are typically restricted to photo-curable polymers and their derivatives. The restricted material hinders the wide implementation of 3D printing in generating customizable and tunable structures for desired applications, such as prototype structures that can be used in studies relating to subsurface hydrocarbon recovery, carbon sequestration, water invasion, geothermal energy extraction, and even extraterrestrial in-situ resource utilization (i.e. water extraction). For these subsurface energy and sustainability applications, it is challenging to apply micro-3D printing to mimic both the morphology and mineralogy of natural rocks. For instance, while a µ-SL printing system can produce a rock model that mimics actual rock microstructures based on rock µ-CT images using its comparable printing resolution, the physiochemical properties of printed micromodel are different from natural minerals. The ability to produce a rock model that has physiochemical properties similar to natural materials would help support more accurate study into many important areas, such as subsurface related studies into hydrocarbon recovery, water infiltration, and carbon sequestration.

BRIEF SUMMARY

Embodiments disclosed herein relate generally to methods of preparing a mineral-coated micromodel. In many embodiments, a thin layer of mineral nanoparticles is seeded in a network of pores of a microporous polymer micromodel by injecting a suspension containing the mineral nanoparticles into the micromodel. In many embodiments, a mineral layer is grown on the thin layer of mineral nanoparticles by injecting an ion-rich solution that then crystallizes from solution, resulting in a micromodel of porous rock that closely mimics natural rock in internal structure, wetting behavior, and chemistry. The resulting micromodel of porous rock can be configured for use in studies in any one of a variety of industrial and scientific areas. In some embodiments, the micromodel can be generated from scans (e.g. µ-CT scans) of natural rock and 3D-printed from a transparent and particle-free resin, which can then be seeded with the mineral nanoparticles and then injected with an ion-rich solution to grow a mineral layer on the mineral nanoparticles.

Embodiments disclosed herein are also generally directed to a porous mineral-coated micromodel made according to any of the methods described herein and containing in-situ grown crystals. The grown crystals can substantially cover the internal surfaces within pores of the micromodel and render the porous interior structurally and chemically similar to that of naturally occurring porous rock. Micromodels as described can remain partly or completely transparent, thus permitting ready visualization and experimental use, and may also provide for reproducible generation of microporous rock-simulating structures.

BRIEF DESCRIPTION OF THE DRAWINGS

Various embodiments in accordance with the present disclosure will be described with reference to the drawings, in which.

DETAILED DESCRIPTION

Figure 1:
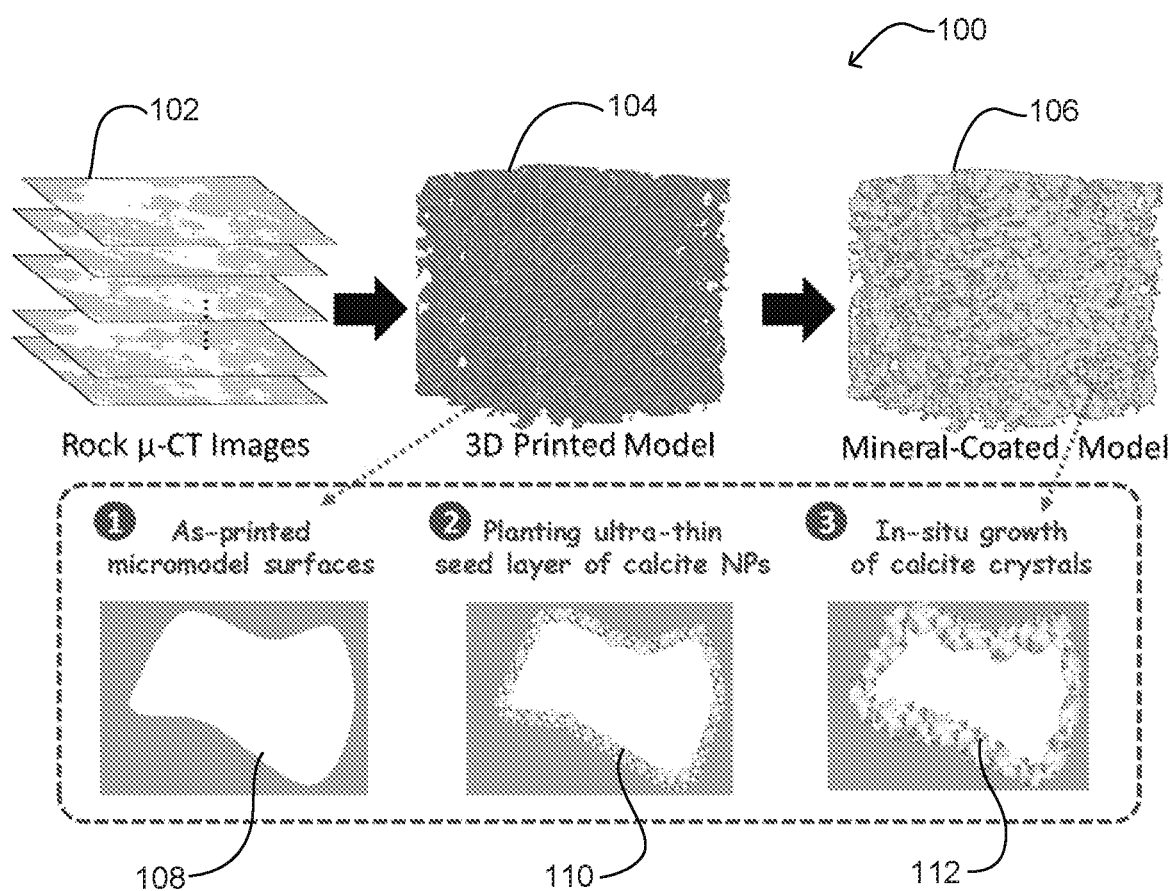
FIG. 1 shows a fabrication approach to preparing a micromodel with in-situ grown microcrystals.

In the following description, various embodiments will be described. For purposes of explanation, specific configurations and details are set forth in order to provide a thorough understanding of the embodiments. However, it will also be apparent to one skilled in the art that the embodiments may be practiced in other configurations, or without the specific details. Furthermore, well-known features may be omitted or simplified in order not to obscure the embodiment being described.

High-resolution 3D printing offers great potential for wide-range applications, but the limited choices of printing materials hinder its deployment in some industries. For example, in subsurface related applications, available polymer-based printing materials are quite different from natural rocks in terms of surface chemistry, crystal structure, and wettability.

Artificial rock models play an important role in the lab-scale reservoir characterization. Currently, fabrication of rock models has limitations in mimicking either the micro-topologies or the physicochemical properties of natural rock, i.e. surface chemistry, crystal structure, and wettability. In the present disclosure, we describe a facile approach to fabricate transparent rock micromodels with micro-3D printing and in-situ mineral coating. Based on micro-CT images of actual rock cores, inch-scale 3D synthetic cores can be directly printed with micron-resolution feature so that the microstructures of rock surfaces are closely simulated. To obtain the same mineralogy with natural rocks, the as-printed 3D rock model is functionalized by in-situ growth of crystals on surfaces of the rock model, including the growth of homogeneous mineral and nonhomogeneous multiple minerals, such as dolomite and calcite.

Embodiments described herein mimic both the morphology and mineralogy of natural carbonate rocks by the fabrication of transparent rock micromodels with micro-3D printing and in-situ mineral coating. In some embodiments, an ultrathin layer of calcite nanoparticles is seeded onto inner surfaces of an as-printed 3D rock micromodel followed by in-situ growth of calcite crystals on the seeded inner surfaces. This approach avoids adding particles into the resin thus preventing light scattering during photopolymerization, which results in improved fidelity of sharp microscopic structures of rock in high-resolution printing. Most importantly, the light transparency of the 3D-printed micromodel can be maintained to better accommodate flow imaging. For demonstration, we visualized the fluid invasion process into the calcite-coated micromodels. The flow dynamics, including interface meniscus, transient flow paths and residual distributions, were clearly observed. In addition, embodiments described herein can be used as a geo-lab-on-a-chip by combining state-of-the-art micro-3D printing and in-situ calcite-coating methods to visualize rock-fluid interactions that are crucial to subsurface energy and sustainability applications including reservoir characterization and enhancing oil recovery.

Polymer composites that include nanomaterials (i.e. carbon nanotube, graphene, ceramic and metal particles) added into polymer resin have been utilized to enhance the thermal, electrical, mechanical properties of 3D printed devices. The addition of calcite particles into a printing polymer resin, however, is not ideal in a µ-SL printing system because the added particles cause severe light scattering, which affects the printing accuracy in creating the micro-structural models of real rock. Another issue is that a polymer/particle composite usually has poor light transparency, which reduces light penetration depth during curing and model transparency for subsequent flow imaging.

An alternative solution to mimic rock mineralogy is through surface modification for the printed micromodel. Mineral coating, including calcite coating for different types of surfaces, can be used to simulate surface mineralogy of real rock. Rock minerals can be coated on the outer surfaces of glass and PDMS (polydimethylsiloxane). In many embodiments, calcite crystals are grown inside a 3D-printed micromodel with microscopic porous structures. In many embodiments, a novel approach is used to mimic both the microscopic morphology and mineralogy of natural carbonates, including surface chemistry and crystal structure, by functionalizing 3D printed micromodels for subsurface applications.

As illustrated in FIG. 1, a fabrication approach 100 includes three main steps: 3D micromodel printing using particle-free resin (HDDA) (102); (ii) Calcite nanoparticles (CalNPs) seeding along the inner surfaces of as-printed micromodel (104); and (iii) In-situ growth of calcite nano/micro montmorillonite crystals inside the micromodel (106). In micromodel printing, the use of particle-free resin in the printing step 102 creates sharply defined features by avoiding lighting scattering in the photopolymerization process. The second step (104) includes coating a seed layer of nanoparticles (e.g., calcite nanoparticles (CalNPs), or other suitable nanoparticles) to fertilize the subsequent uniform growth of calcite nano/micro crystals. This process maintains the transparency of the 3D micromodel.

In the second step 104, sharply defined as-printed micromodel surfaces 108 are coated with an ultra-thin seed layer of calcite nanoparticles 110, which promote the in-situ growth of calcite crystals 112. In the third step (iii) (106) nano/micro crystals (e.g. montmorillonite crystals, or other suitable crystal structures) are grown inside the micromodel. In this third step 106, by injecting different ion-rich solutions into the model, the controlled growth of desired crystals can be achieved. For example, to grow calcite crystals, a supersaturated solution of $Ca^{2+}$ and $CO_3^{2}$ can be injected into the micromodel. For non-homogeneous crystal growth, a mixture of different ions can be injected. In some alternative embodiments, for non-homogeneous growth, subsequent ion substitution can be used on the crystal layer, such as magnesium/calcium ion substitution. By controlling the flow path of an ion-rich solution, locally-controlled crystal growth can also be achieved.

Figure 2:
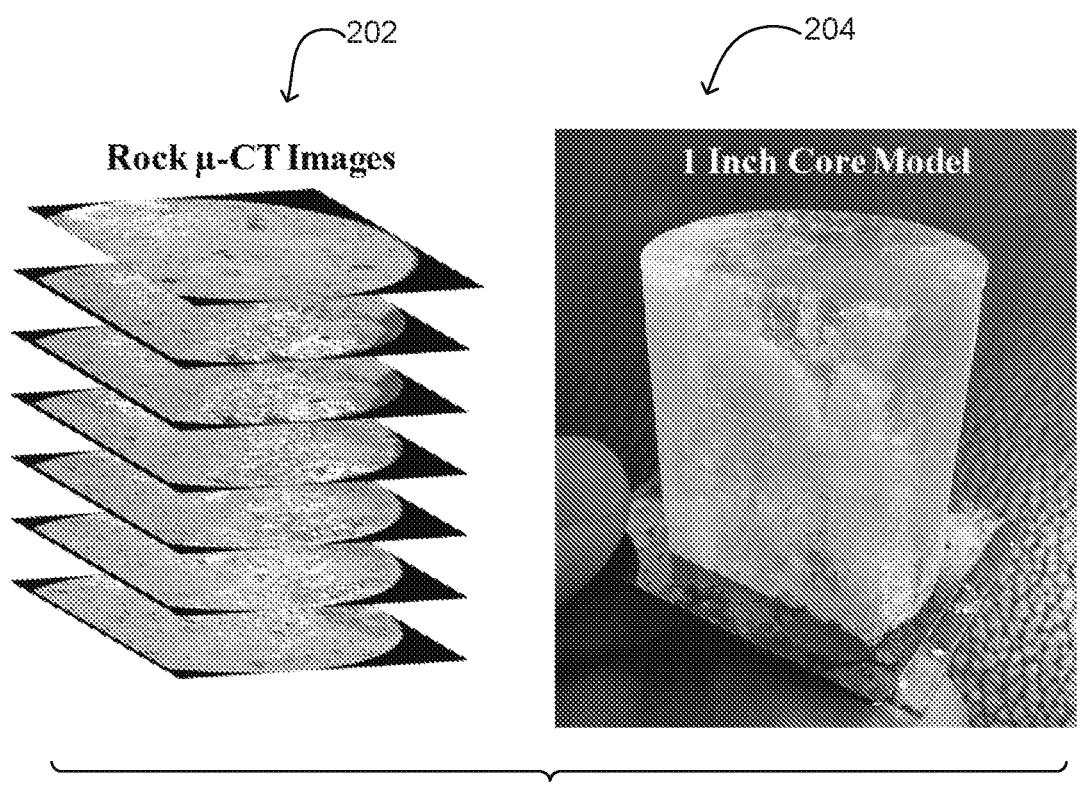
FIG. 2 shows a set of natural rock micro-CT (µ-CT) images and corresponding printed core model.

The micromodel can have any suitable configuration. For example, the micromodel can be a 3D micromodel printed from a set of rock core micro-CT images. As shown in FIG. 2, a set of micro-CT images 202 can be captured and used to produce a functionalized rock core model 204.

Figure 3A:
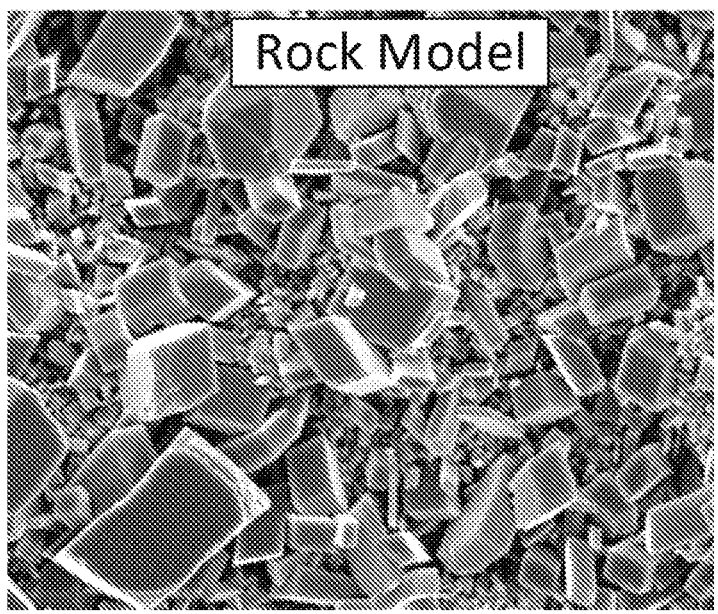
FIG. 3A is an SEM image showing a fabricated rock micromodel.
Figure 3B:
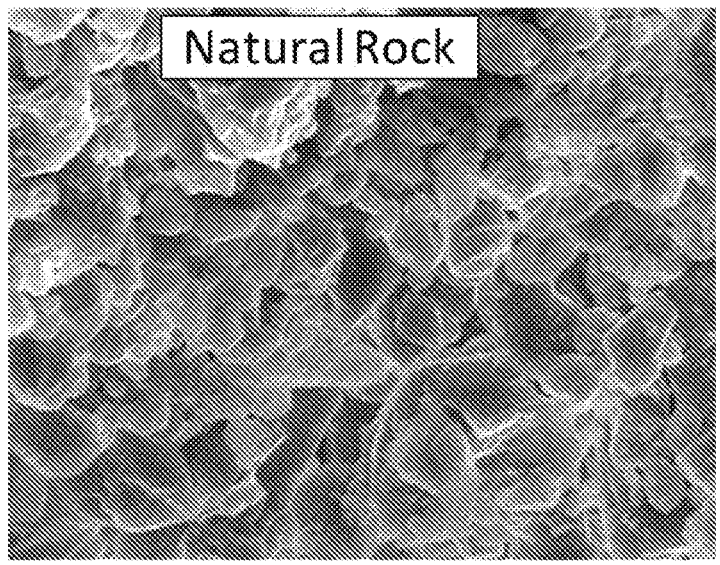
FIG. 3B is an SEM image showing natural rock for comparison with the micromodel of FIG. 3A.

Structures produced by the methods disclosed herein can have substantially the same micro-scale morphology as the analogous natural rock surfaces, as shown in FIGS. 3A and 3B. FIG. 3A shows a scanning electron microscope (SEM) image 300a of the surface morphology of the calcite-coated 3D-printed micromodel. After the in-situ growth, the sizes of calcite crystals can be identified clearly ranging from sub-micron to a few microns. For comparison, FIG. 3B shows an SEM image 300b of the natural carbonate rock. Similar surface morphology can be observed between the calcite-coated micromodel surfaces and the natural rock surfaces.

Figure 4:
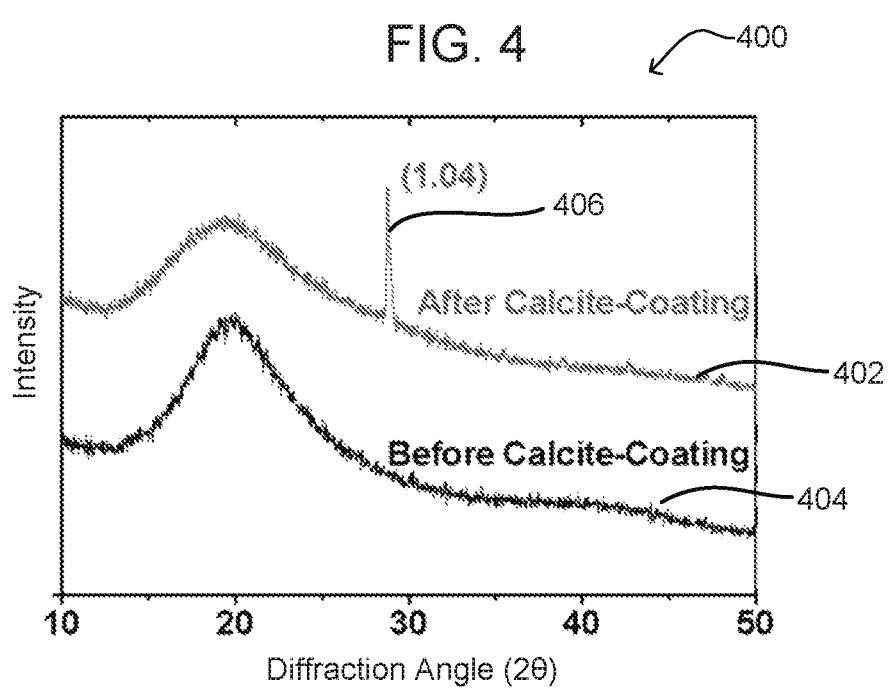
FIG. 4 is a graphical representation of a dispersive X-ray spectroscopy (XRD) spectra of an uncoated and a calcite-coated micromodel surface.

Structures produced by the methods disclosed herein can have substantially the same physiochemical properties with reference to carbonate rock, including but not limited to water-wet surface wettability. FIG. 4 is a graphical representation 400 of X-ray diffraction (XRD) spectra, showing intensity as a function of diffraction angle for samples of a calcite coated micromodel after calcite coating 402 and before calcite coating 404. A characteristic peak 406 at 29.43 degree corresponding to (104) crystalline plane confirms the growth of calcite crystals. Under experimental conditions, the contact angle of a water droplet deposited on the calcite-coated surface decreases with the amount of time permitted for calcite crystal growth. After 1 hour of growth, the water droplet can form on the surface with a contact angle of 44 degrees. After 2.5 hours of growth, the water droplet's contact angle receded to zero indicating that the surface has become totally water wet.

Figure 5:
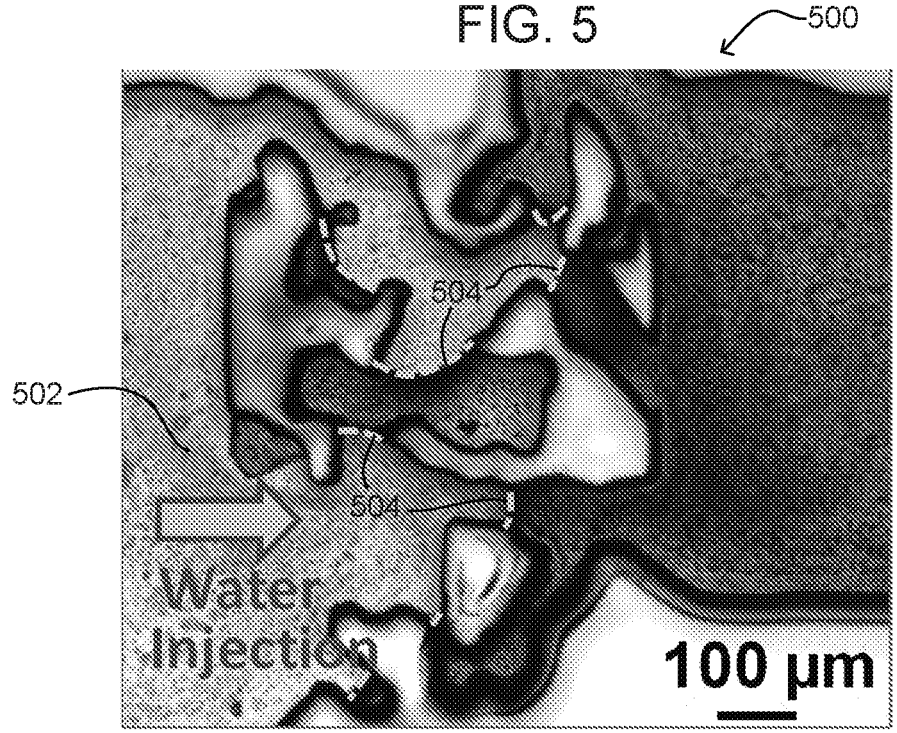
FIG. 5 is an optical microscope image of a micromodel with rock pore/throat patterns based on real rock µ-CT images.

Structures produced by the methods disclosed herein can also be transparent and suitable for flow imaging studies. Good light transparency allows the visualization and study of multi-fluids displacement dynamics and trapping mechanism between crude oil, water, gas and calcite surfaces. As a case study, FIG. 5 is an optical microscope image 500 of a micromodel with rock pore/throat patterns based on real rock μ-CT images, in which a water injection process into a gas-containing model is visualized under the optical microscope. As shown in FIG. 5, an injected volume of water 502 displaces gas in the micromodel forming visible boundaries 504 as the water progresses. Similar injection/displacement patterns can be observed with respect to displacement of other substances, and for investigating multiphase fluid displacement and trapping mechanism between crude oil, water, gas and calcite surfaces. There are many other applications, such as carbon geo-sequestration. Brine-$CO_2$ displacement is analogous to the trapping of oil or gas in water flooded extraction, but also likely in combination with geochemical reaction. The clear observation of fluids displacement dynamics provides important insights into multiphase flow in porous media, specifically for studying the impact of surface wettability, interfacial tension, viscosity ratio, and even chemical reactions on the geo-fluids flow behavior. A 3D-printed micromodel with calcite coating can be used in a reservoir-on-a-chip that accurately simulates natural carbonate rock surface morphology and chemistry.

Experimental Validation

A custom-made μ-SL printing system was used in the fabrication of high-resolution 3D micromodels. In some instances, a photo-curable resin comprising a mixture of 1,6-Hexanediol diacrylate, Mn 250 (HDDA), photo-initiator 2 wt % Phenylbis (2,4,6-trimethyl benzoyl) phosphine oxide, and photo-absorber 0.05 wt % Sudan I was used. It should be noted that no CalNPs were added into the resin. This particle-free resin was cured by exposing it to light (emission spectrum centered at 408 nm). The layer-by-layer photopolymerization resulted in a complex 3D anisotropic model with a 10 μm feature resolution.

Figure 6:
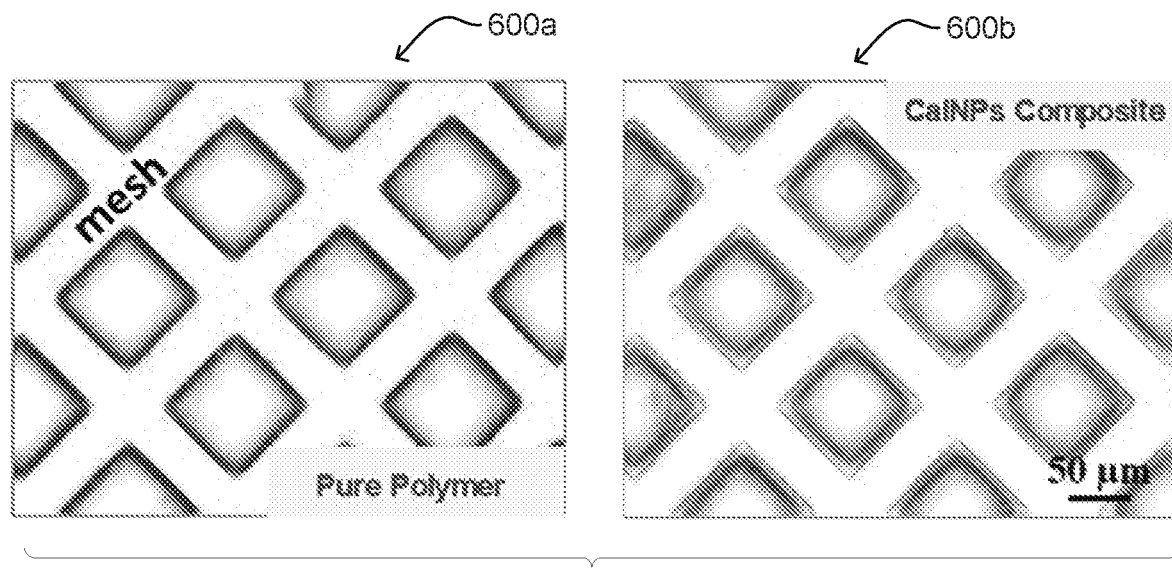
FIG. 6 is a pair of images showing a mesh pattern printed using polymer resin with and without calcite nanoparticles.

In order to emphasize the necessity of using particle-free resin for the printing of accurate microscopic structure, we evaluated the impact of added particles on the printing precision. FIG. 6 shows a pair of images 600a, 600b showing a mesh pattern printed using the resin with/without CalNPs. As shown in the first image 600a, a very clear and sharp boundary is observed under optical microscope when there are no CalNPs added. In contrast, a fuzzy interface is observed in the second image 600b after adding CalNPs. The sharp boundary of the sidewalls cannot be retrieved due to light scattering, which ultimately deteriorates the printing resolution. To explain this, finite-difference-time-domain (FDTD) optical simulations are performed on the light penetration during the printing process.

Figure 7:
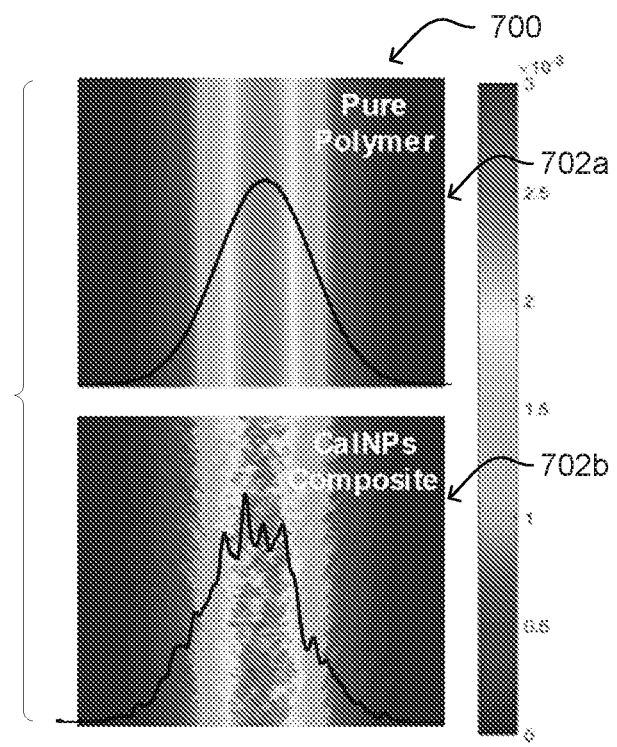
FIG. 7 is a pair of FDTD simulation charts illustrating the light intensity distribution inside a polymer resin with and without calcite nanoparticles.

FIG. 7 is a collection of FDTD simulation charts 700 illustrating the light distribution inside the resin with CalNPs (702b) and without CalNPs (702a). A Gaussian light beam was illuminated at plane Z=0 and the light propagated into the resin along the z-direction, while its light intensity distribution of the XZ cross-section was collected. In FIG. 7, the light field shows that without any NPs inside the resin, the profile of the incident light intensity is maintained as a smooth Gaussian distribution (702a), meaning that the light pattern remains the same during its penetration. However, after adding CalNPs into the resin, the light was scattered and its intensity distribution became sparkling inside the polymer/CalNPs composite 702b. The sparking/dimming spots and observed fluctuations from the light intensity distribution strongly evidenced the light scattering, which was induced by the added particles. Because the shape of the printed feature is formed by the exposure of light with a certain pattern, the variant of light patterns could cause the loss in printing precision.

Figure 8:
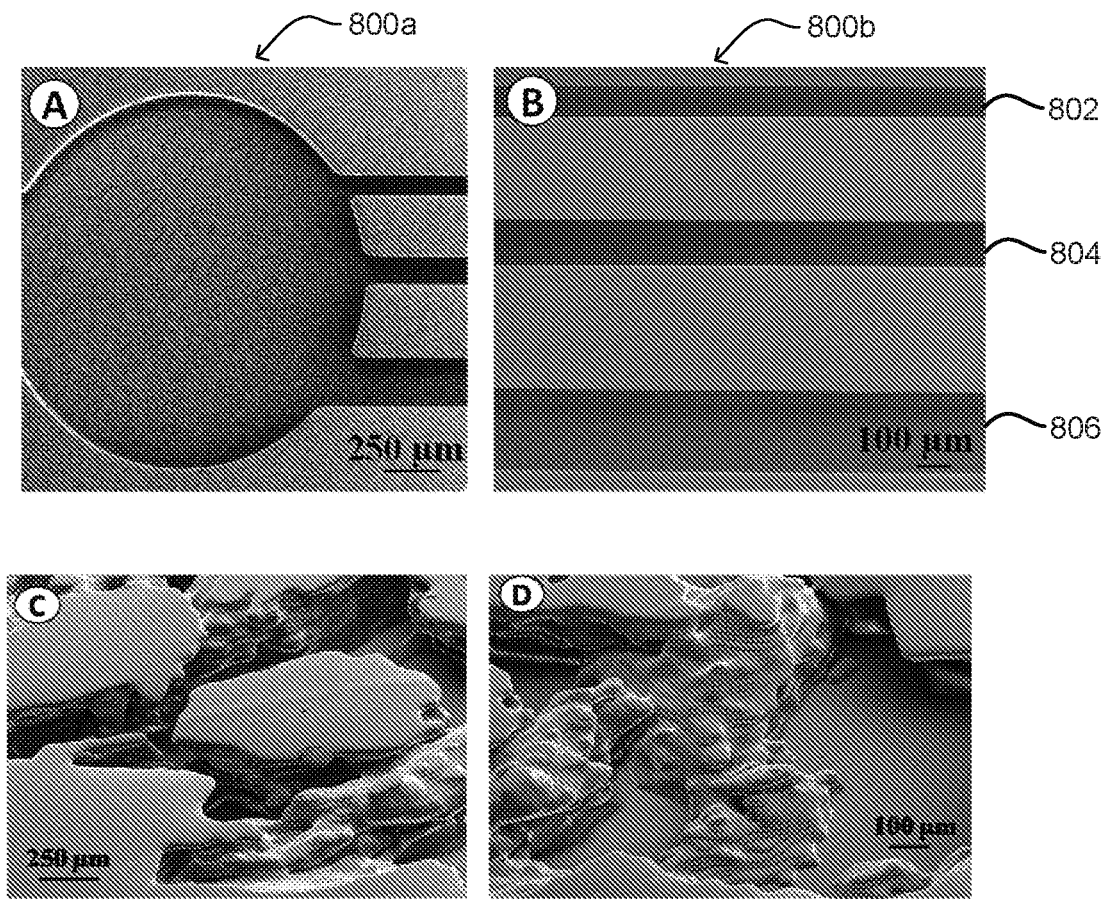
FIG. 8 shows SEM images illustrating sharply defined channels and 3-dimensional rock patterns formed in a printed test sample.

As a benchmark study, a micromodel including three parallel channels 802, 804, 806 with an inlet and outlet was fabricated, as shown in FIG. 8, with scale bars at 250 μm (800a) and 100 μm (800b). Under a scanning electron microscope, the smooth and sharp boundaries of the parallel channels 802, 804, 806 are clearly observed with a half-printed model. The measured width of each channel is 116±2 (802), 174±2 (804) and 305±2 μm (806), respectively. FIG. 8 illustrates a three-dimensional rock micromodel that was printed based on a stack of μ-CT images. The μ-CT images contain more complicated pore-throat patterns of carbonate rock. SEM images (shown in FIGS. 8 C and D) of as-printed pattern confirms that the original rock features, e.g. the narrow throats and small solid grains, are well captured and retrieved by 3D micromodels. These observations manifest the superior capability of micro-3D printing in fabricating rock micromodels with 2 μm micro-meter feature resolution and complex 3D structures.

To mimic the surface mineralogy of carbonate rock, a solution-based coating approach is developed for in-situ calcite crystal growth on the inner surface of as-printed micromodels. Firstly, a homogenous seed solution was prepared by diluting the resin containing 1 wt % of CalNPs. Diluting the seed solution with solvent (IPA) promoted the formation of an ultra-thin liquid film in the confined space by decreasing its viscosity and surface tension. After 3 hours of ultrasonication, the homogenous suspension was ready to form a uniform calcite coating. In order to plant the CalNPs seeds on the inner surfaces of the as-printed micromodel, the seed suspension was pushed by pressurized nitrogen gas into the channels of the micromodel for approximately 10 minutes, followed by a nitrogen gas purge for approximately 20 minutes to remove excessive solution from the 3D micromodel. After alternating the injection of the seed solution and nitrogen gas for two cycles, the micromodel was placed under vacuum to facilitate the evaporation of solvent from the seed layer. The micromodel was then exposed under the light for 1 hour to solidify the seed layer. Eventually, an ultrathin CalNPs seed layer is formed on the confined inner surfaces of the micromodel.

To grow the calcite crystals, a supersaturated solution of $Ca^{2+}$ and $CO_3^{2-}$ ions were injected into the micromodel. By supplying fresh solutions into the 3D micromodel, the cationic and anionic concentrations were maintained to grow high-quality calcite crystals. Spontaneous precipitation may occur when solutions are not replaced frequently, which could result in unwanted non-uniform precipitation of calcite crystals. Thus, we replaced the $Ca^{2+}$ and $CO_3^{2-}$ ion after completing the growth of calcite nanocrystals during the first 30 minutes, and the 3D micromodel was then dried by blowing dry nitrogen there through. By alternating the outlet and inlet during the injection, another three rounds of 30-minute injections of the supersaturated solution were conducted. The flow rate of ion-rich solution was well-controlled to form laminar flow inside the micromodel and to avoid any flow vortexes that could affect the crystal growth uniformity. During the whole process, the printed micromodel was placed in a water bath at 40° C.

Figure 9:
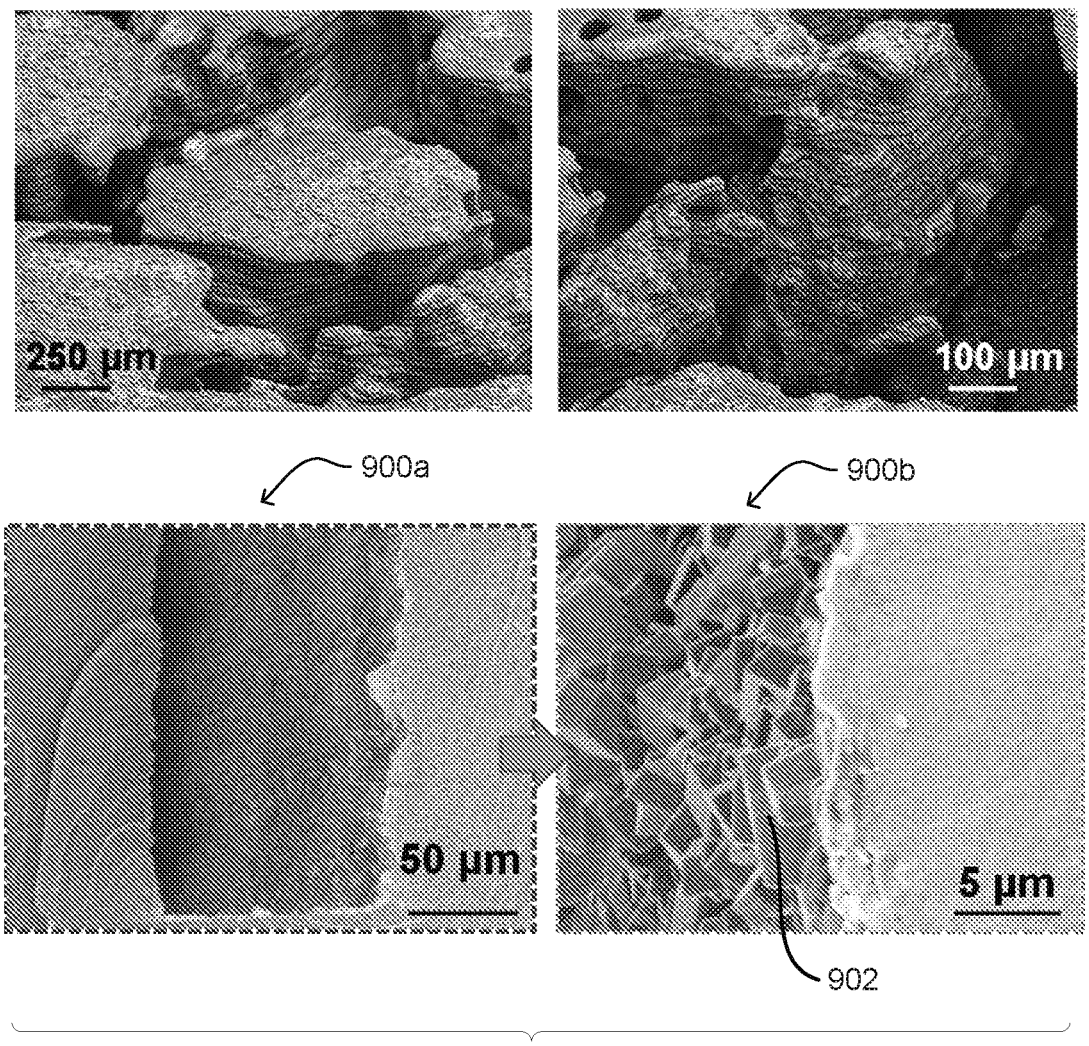
FIG. 9 shows SEM images of inner surfaces of the printed test sample of FIG. 8 after calcite-coating.

After in-situ calcite growth, surface morphology of the calcite-coated micromodel was characterized using scanning electron microscopy (SEM). FIG. 9 shows the SEM images of the calcite-coated inner surfaces of the micromodels after with 3-dimensional pore-throat network (FIG. 9, the first two images) and in micro-channels (FIG. 9, the last two images). Compared to the surfaces before coating (FIG. 8), a very dense layer of calcite crystal 902 is formed on the inner surfaces of the micromodel after calcite-coating. From the SEM images, the sizes of calcite crystals can be identified clearly ranging from sub-micron to a few microns after growth for 120 minutes. Similar surface morphology can be observed between the calcite-coated micromodel surfaces and the natural rock surfaces (FIG. 3B).

Surface wettability reflects the adhesion strength between fluids and solid surfaces. It plays an important role in controlling the multiphase flow dynamics. The surface wettability can be characterized by contact angle. Contact angle hysteresis, known as the advancing and receding contact angle, is also important in characterizing the wettability of rough surfaces. Table 1 (below) presents the measurements of static contact angles and contact angle hysteresis for the pure and calcite-coated polymeric HDDA surfaces, where a significant change of micromodel's surface wettability is observed after calcite-coating.

TABLE (1)

Surface wettability before and after calcite growth

| | Surface Type | $\theta_e$ (°) | $\theta_{ad}$ (°) | $\theta_{re}$ (°) |
|---|---|---|---|---|
| Water in Oil | Intrinsic HDDA | 123 ± 3 | 147 ± 2 | 62 ± 5 |
| | Calcite-Coated | 62 ± 3 | 101 ± 6 | 0 |
| Water in Air | Intrinsic HDDA | 87 ± 3 | 93 ± 4 | 43 ± 5 |
| | Calcite-Coated | Complete Wetting | | |

The intrinsic water contact angle of pure polymeric HDDA is 87±3°, and its advancing and receding contact angles are 93±4° and 43±5°, respectively. The calcite-coated surface is totally water-wet as reported before. When a water droplet is deposited on the calcite coated polymeric HDDA surface, it instantly spreads on the surface. The surface becomes more water-wet because the calcite crystals become denser after longer growth time. Moreover, the contact angle of water in the presence of oil (decane) is also measured for the aforementioned surfaces, which can provide a direct reference in evaluating water-oil displacement efficiency inside rock porous media. On the pure polymeric HDDA surface, the contact angle of water-in-oil is 123±3°, while the contact angle becomes 62±3° after calcite coating. The contact angle hysteresis of water in oil is also measured, and the values can also be found in Table 1.

Figure 10:
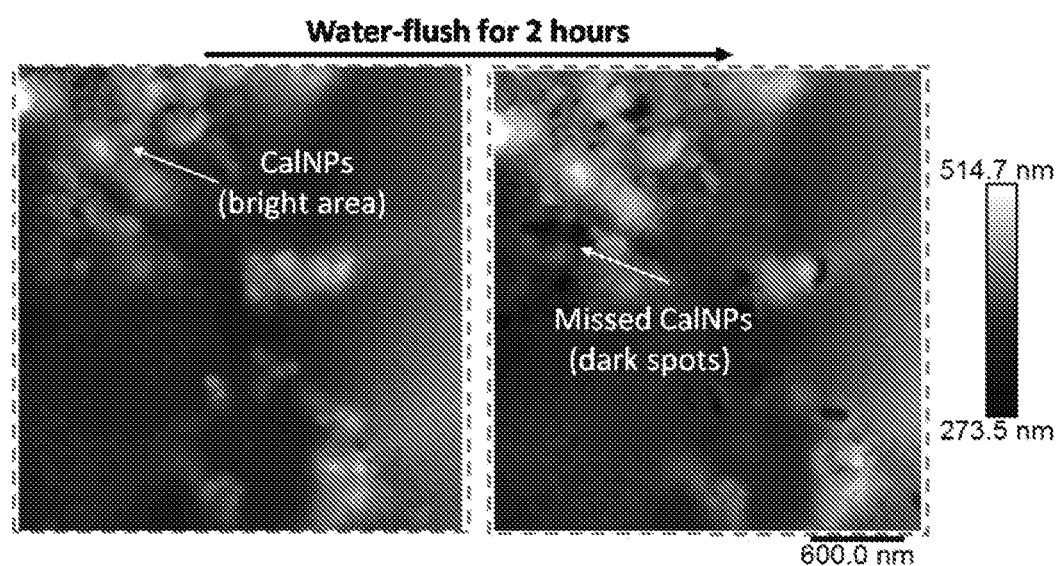
FIG. 10 illustrates coating stability as evidenced by Cal-NPs distribution under an atomic force microscope (AFM)

The stability of CaINPs coating was evaluated with water-flush experiments. The micromodel was placed in the flowing water that created by magnetic stirring machine, 700 rpm for 2 h. The CaINPs distribution on the surface was then checked with the atomic force microscope (AFM). FIG. 10 shows the CaINPs distribution before and after water flushing. The bright area indicates the existence of CaINPs while the black holes in the second image are the missing CaINPs after water flush. Based on large area AFM scan, around 70% of CaINPs remained on the surfaces after water flush, which proves very good stability of the CaINPs layer. This is owing to capillarity-enhanced CaINP immobilization, which is achieved with an appropriate formulation of seed solution by adding highly volatile solvent, IPA.

Figure 11:
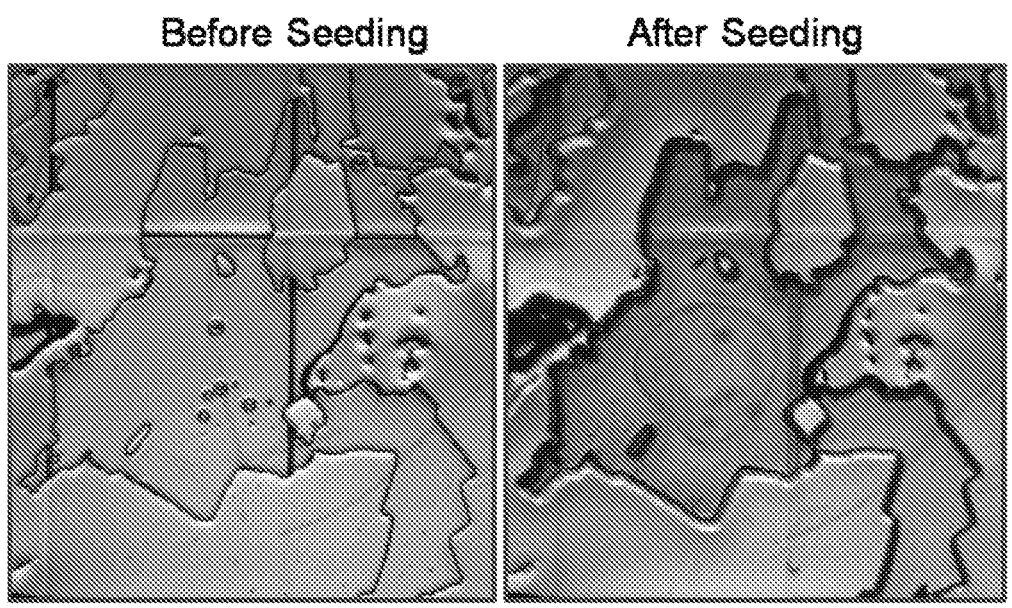
FIG. 11 shows pore-throat patterns of a rock micromodel before and after seeding calcite nanoparticles on the illustrated surfaces.

Diluting seed solution with IPA can also promote the formation of an ultrathin liquid film in confined space of porous media by decreasing its viscosity and surface tension. IPA has very low surface tension (~23 mN/m) and low viscosity (~1.96 mPa·s), thus enhancing the fluidity of CaINPs seed solution. The subsequent slow evaporation of IPA results in a very thin seed layer. FIG. 11 shows the images of rock micromodel before and after seeding, and it was found that the seed layer does not considerably change the sizes of pore-throat patterns.

Figure 12:
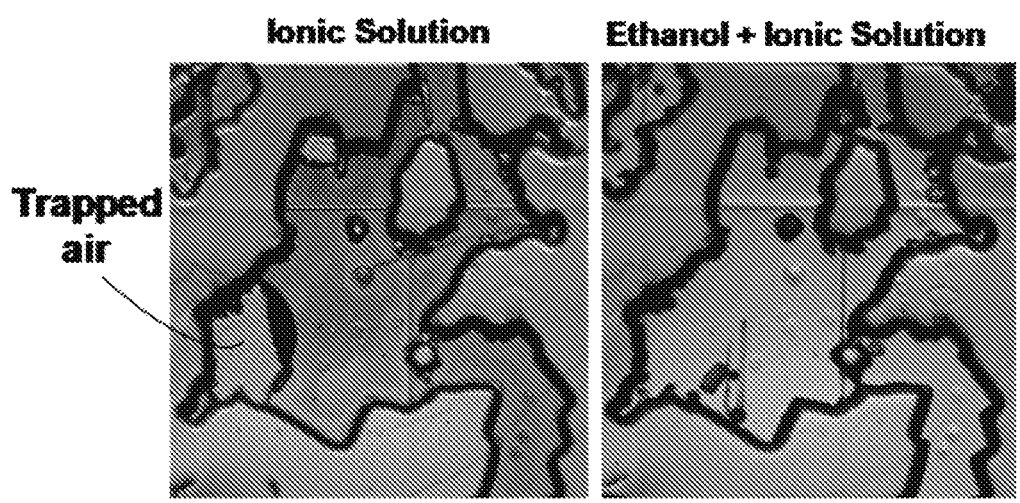
FIG. 12. shows trapped air during an injection of ionic solution for calcite growth.

In calcite growth, if the $Ca^{2+}$ and $CO_3^{2-}$ ionic solution is directly injected into the micromodel, there would be some air trapped along the surfaces (FIG. 12, the first image) due to poor wetting capability of solution. Consequently, the weak contact of ionic solution with surface would cause non-uniform calcite growth. To resolve this issue, we first injected the mixture of ethanol and ionic solution to displace all the air out, as shown in FIG. 12, the second image. Here, ethanol is used to change the surface tension, thus controlling the swept area of ionic solution in the porous micromodel.

Various computational methods discussed above may be performed in conjunction with or using a computer or other processor having hardware, software, and/or firmware. The various method steps may be performed by modules, and the modules may comprise any of a wide variety of digital and/or analog data processing hardware and/or software arranged to perform the method steps described herein. The modules optionally comprising data processing hardware adapted to perform one or more of these steps by having appropriate machine programming code associated therewith, the modules for two or more steps (or portions of two or more steps) being integrated into a single processor board or separated into different processor boards in any of a wide variety of integrated and/or distributed processing architectures. These methods and systems will often employ a tangible media embodying machine-readable code with instructions for performing the method steps described above. Suitable tangible media may comprise a memory (including a volatile memory and/or a non-volatile memory), a storage media (such as a magnetic recording on a floppy disk, a hard disk, a tape, or the like; on an optical memory such as a CD, a CD-R/W, a CD-ROM, a DVD, or the like; or any other digital or analog storage media), or the like.

The particulars shown herein are by way of example and for purposes of illustrative discussion of the preferred embodiments of the present invention only and are presented in the cause of providing what is believed to be the most useful and readily understood description of the principles and conceptual aspects of various embodiments of the invention. In this regard, no attempt is made to show structural details of the invention in more detail than is necessary for the fundamental understanding of the invention, the description taken with the drawings and/or examples making apparent to those skilled in the art how the several forms of the invention may be embodied in practice.

The following definitions and explanations are meant and intended to be controlling in any future construction unless clearly and unambiguously modified in the following examples or when application of the meaning renders any construction meaningless or essentially meaningless. In cases where the construction of the term would render it meaningless or essentially meaningless, the definition should be taken from Webster's Dictionary, 3rd Edition or a dictionary known to those of skill in the art, such as the Oxford Dictionary of Biochemistry and Molecular Biology (Ed. Anthony Smith, Oxford University Press, Oxford, 2004).

Unless the context clearly requires otherwise, throughout the description and the claims, the words 'comprise', 'comprising', and the like are to be construed in an inclusive sense as opposed to an exclusive or exhaustive sense; that is to say, in the sense of "including, but not limited to". Words using the singular or plural number also include the plural and singular number, respectively. Additionally, the words "herein," "above," and "below" and words of similar import, when used in this application, shall refer to this application as a whole and not to any particular portions of the application.

The description of embodiments of the disclosure is not intended to be exhaustive or to limit the disclosure to the precise form disclosed. While the specific embodiments of, and examples for, the disclosure are described herein for illustrative purposes, various equivalent modifications are possible within the scope of the disclosure, as those skilled in the relevant art will recognize.

Aspects of the disclosure can be modified, if necessary, to employ the systems, functions, and concepts of the above references and application to provide yet further embodiments of the disclosure. These and other changes can be made to the disclosure in light of the detailed description.

Specific elements of any foregoing embodiments can be combined or substituted for elements in other embodiments. Furthermore, while advantages associated with certain embodiments of the disclosure have been described in the context of these embodiments, other embodiments may also exhibit such advantages, and not all embodiments need necessarily exhibit such advantages to fall within the scope of the disclosure.

While the above provides a full and complete disclosure of exemplary embodiments of the present invention, various modifications, alternate constructions and equivalents may be employed as desired. Consequently, although the embodiments have been described in some detail, by way of example and for clarity of understanding, a variety of modifications, changes, and adaptations will be obvious to those of skill in the art. Accordingly, the above description and illustrations should not be construed as limiting the invention, which can be defined by the appended claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

All references, including publications, patent applications and patents, cited herein are hereby incorporated by reference to the same extent as if each reference were individually and specifically indicated to be incorporated by reference and were set forth in its entirety herein.

Examples of the embodiments of the present disclosure can be described in view of the following clauses:

Clause 1. A method of preparing a mineral-coated rock micromodel, the method comprising seeding a thin layer of mineral nanoparticles in a network of pores of a microporous polymer micromodel by injecting a suspension comprising the mineral nanoparticles through the microporous polymer micromodel and growing a mineral layer on the thin layer of mineral nanoparticles in the network of pores by injecting a first ion-rich solution configured to crystallize from solution in response to contacting the mineral nanoparticles.

Clause 2. The method of clause 1, wherein the mineral nanoparticles comprises calcite nanoparticles.

Clause 3. The method of clause 1, wherein the mineral layer comprises nanocrystals.

Clause 4. The method of clause 1, wherein the mineral layer comprises microcrystals.

Clause 5. The method of clause 1, wherein the mineral layer comprises calcite crystals.

Clause 6. The method of clause 5, wherein the first ion-rich solution comprises a supersaturated solution comprising $Ca^{2+}$ and $CO_3^{2-}$.

Clause 7. The method of clause 6, further comprising performing ion substitution on the mineral layer by injecting a second ion-rich solution into the microporous polymer micromodel.

Clause 8. The method of clause 7, wherein the second ion-rich solution comprises magnesium ions.

Clause 9. The method of clause 1, wherein the mineral layer comprises calcite montmorillonite crystals.

Clause 10. The method of clause 1, wherein the growing of the mineral layer comprises injecting a second ion-rich solution into the microporous polymer micromodel that the mineral layer comprises a non-homogeneous mixture of crystals produced by non-homogeneous crystal growth.

Clause 11. The method of clause 1, wherein the growing of the mineral layer comprises controlling a flow path of the first ion rich solution within the microporous polymer micromodel to locally-control crystal growth within the microporous polymer micromodel.

Clause 12. The method of clause 1, wherein the microporous polymer micromodel is transparent.

Clause 13. The method of clause 1, wherein the microporous polymer micromodel is printed from a photo-curable polymer and the suspension comprising the mineral nanoparticles comprises a dilution comprising a solvent and the photo-curable monomer.

Clause 14. The method of clause 13, wherein the solvent comprises isopropyl alcohol.

Clause 15. The method of clause 13, wherein the suspension is injected into the microporous polymer micromodel by pressurized nitrogen gas.

Clause 16. The method of clause 15, wherein the seeding of the thin layer of mineral nanoparticles comprises performing a nitrogen gas purge to remove a quantity of the suspension comprising the mineral nanoparticles from the microporous polymer micromodel.

Clause 17. The method of clause 16, wherein the seeding of the thin layer of mineral nanoparticles comprises subjecting the microporous polymer micromodel to a vacuum to facilitate evaporation of the solvent.

Clause 18. The method of clause 13, wherein the seeding of the thin layer of mineral nanoparticles comprises exposing the microporous polymer micromodel to light to photo-cure a layer of the suspension to form a seed layer comprising the mineral nanoparticles on confined inner surfaces of the microporous polymer micromodel.

Clause 19. The method of any one of clauses 1 through 12, further comprising printing the microporous polymer micromodel from a particle-free photo-curable polymer and curing the microporous polymer micromodel by exposing the photo-curable polymer to light.

Clause 20. The method of clause 19, wherein printing the microporous polymer micromodel comprises receiving structural data of a porous rock and printing the microporous polymer micromodel based on the structural data such that an internal structure of the microporous polymer micromodel simulates the porous rock.

Clause 21. The method of any one of clauses 13 through 18, further comprising printing the microporous polymer micromodel from the photo-curable polymer and curing the microporous polymer micromodel by exposing the photo-curable polymer to light.

Clause 22. The method of clause 21, wherein printing the microporous polymer micromodel comprises receiving structural data of a porous rock and printing the microporous polymer micromodel based on the structural data such that an internal structure of the microporous polymer micromodel simulates the porous rock.

Clause 23. A rock micromodel comprising a microporous polymer substrate comprising surface pores, a thin layer of seeded mineral nanoparticles coating the surface pores, and a mineral layer grown on the thin layer of seeded mineral nanoparticles.

Clause 24. The rock micromodel of clause 23, wherein the seeded mineral nanoparticles comprise calcite.

Clause 25. The rock micromodel of clause 23, wherein the mineral layer comprises calcite crystals.

Clause 26. The rock micromodel of clause 23, wherein the mineral layer comprises dolomite crystals.

Clause 27. The rock micromodel of clause 23, wherein the microporous polymer substrate is transparent.

Clause 28. The rock micromodel of clause 23, wherein the mineral layer comprises nanocrystals.

Clause 29. The rock micromodel of clause 23, wherein the mineral layer comprises microcrystals.

Clause 30. The rock micromodel of clause 23, wherein the mineral layer comprises calcite montmorillonite crystals.

Clause 31. The rock micromodel of clause 23, wherein the mineral layer comprises a non-homogeneous mixture of crystals.

What is claimed is:

1. A method of preparing a mineral-coated transparent rock micromodel, the method comprising:
   seeding a thin layer of mineral nanoparticles in a network of pores of a microporous polymer micromodel by injecting a suspension comprising the mineral nanoparticles through the microporous polymer micromodel, wherein the microporous polymer micromodel is printed from a particle-free photo-curable polymer, and wherein the suspension comprising the mineral nanoparticles comprises a dilution comprising a solvent and the particle-free photo-curable polymer; and
   growing a mineral layer on the thin layer of mineral nanoparticles in the network of pores by injecting a first ion-rich solution configured to crystallize from solution in response to contacting the mineral nanoparticles.

2. The method of claim 1, wherein the mineral nanoparticles comprises calcite nanoparticles.

3. The method of claim 1, wherein the mineral layer comprises nanocrystals.

4. The method of claim 1, wherein the mineral layer comprises microcrystals.

5. The method of claim 1, wherein the mineral layer comprises calcite crystals.

6. The method of claim 5, wherein the first ion-rich solution comprises a supersaturated solution comprising $Ca^{2+}$ and $CO_3^{2-}$.

7. The method of claim 6, further comprising performing ion substitution on the mineral layer by injecting a second ion-rich solution into the microporous polymer micromodel.

8. The method of claim 7, wherein the second ion-rich solution comprises magnesium ions.

9. The method of claim 1, wherein the mineral layer comprises calcite montmorillonite crystals or dolomite crystals.

10. The method of claim 1, wherein the growing of the mineral layer comprises injecting a second ion-rich solution into the microporous polymer micromodel that the mineral layer comprises a non-homogeneous mixture of crystals produced by non-homogeneous crystal growth.

11. The method of claim 1, wherein the growing of the mineral layer comprises controlling a flow path of the first ion-rich solution within the microporous polymer micromodel to locally-control crystal growth within the microporous polymer micromodel.

12. The method of claim 1, wherein the microporous polymer micromodel is transparent.

13. The method of claim 1, wherein the solvent comprises isopropyl alcohol.

14. The method of claim 1, wherein the suspension is injected into the microporous polymer micromodel by pressurized nitrogen gas.

15. The method of claim 14, wherein the seeding of the thin layer of mineral nanoparticles comprises performing a nitrogen gas purge to remove a quantity of the suspension comprising the mineral nanoparticles from the microporous polymer micromodel.

16. The method of claim 15, wherein the seeding of the thin layer of mineral nanoparticles comprises subjecting the microporous polymer micromodel to a vacuum to facilitate evaporation of the solvent.

17. The method of claim 1, wherein the seeding of the thin layer of mineral nanoparticles comprises exposing the microporous polymer micromodel to light to photo-cure a layer of the suspension to form a seed layer comprising the mineral nanoparticles on confined inner surfaces of the microporous polymer micromodel.

18. The method of claim 1, further comprising:
    receiving structural data of a porous rock;
    printing the microporous polymer micromodel from a particle-free photo-curable polymer based on the structural data such that an internal structure of the microporous polymer micromodel simulates the porous rock; and
    curing the microporous polymer micromodel by exposing the particle-free photo-curable polymer to light.

19. A rock micromodel, comprising:
    a microporous polymer substrate comprising surface pores;
    a thin layer of seeded mineral nanoparticles coating the surface pores; and
    a mineral layer grown on the thin layer of seeded mineral nanoparticles, wherein the mineral layer comprises at least one of dolomite crystals, calcite montmorillonite crystals, or a non-homogeneous mixture of crystals.

20. The rock micromodel of claim 19, wherein the mineral layer comprises dolomite crystals.

21. The rock micromodel of claim 19, wherein the mineral layer comprises calcite montmorillonite crystals.

22. The rock micromodel of claim 19, wherein the mineral layer comprises the non-homogeneous mixture of crystals.

* * * * *